(12) United States Patent
Sung et al.

(10) Patent No.: US 9,324,688 B2
(45) Date of Patent: Apr. 26, 2016

(54) EMBEDDED PACKAGES HAVING A CONNECTION JOINT GROUP

(71) Applicant: SK HYNIX INC., Icheon (KR)

(72) Inventors: Ki Jun Sung, Cheongju (KR); Seung Jee Kim, Seongnam (KR); Jong Hyun Nam, Seoul (KR); Sang Yong Lee, Yongin (KR); Young Geun Yoo, Bucheon (KR)

(73) Assignee: SK HYNIX INC., Icheon (KR)

( * ) Notice: Subject to any disclaimer, the term of this patent is extended or adjusted under 35 U.S.C. 154(b) by 2 days.

(21) Appl. No.: 14/273,485

(22) Filed: May 8, 2014

(65) Prior Publication Data

US 2015/0179608 A1 Jun. 25, 2015

(30) Foreign Application Priority Data

Dec. 23, 2013 (KR) ........................ 10-2013-0161189

(51) Int. Cl.
| | |
|---|---|
| H01L 25/065 | (2006.01) |
| H01L 23/00 | (2006.01) |
| H01L 25/03 | (2006.01) |
| H05K 1/18 | (2006.01) |
| H05K 3/46 | (2006.01) |
| H01L 23/538 | (2006.01) |

(52) U.S. Cl.
CPC ............ *H01L 25/0652* (2013.01); *H01L 24/09* (2013.01); *H01L 24/20* (2013.01); *H01L 24/73* (2013.01); *H01L 25/03* (2013.01); *H05K 1/185* (2013.01); *H05K 3/4697* (2013.01); *H01L 23/5389* (2013.01); *H01L 24/13* (2013.01); *H01L 24/16* (2013.01); *H01L 24/19* (2013.01); *H01L 24/29* (2013.01); *H01L 24/32* (2013.01); *H01L 2224/09134* (2013.01); *H01L 2224/12105* (2013.01); *H01L 2224/131* (2013.01); *H01L 2224/16145* (2013.01); *H01L 2224/16227* (2013.01); *H01L 2224/2101* (2013.01); *H01L 2224/215* (2013.01); *H01L 2224/2919* (2013.01); *H01L 2224/32225* (2013.01); *H01L 2224/73209* (2013.01); *H01L 2224/73253* (2013.01); *H01L 2224/73267* (2013.01); *H01L 2225/06541* (2013.01); *H01L 2924/15153* (2013.01); *H01L 2924/181* (2013.01); *H05K 2201/1053* (2013.01); *H05K 2201/10515* (2013.01); *H05K 2201/10674* (2013.01); *H05K 2201/10734* (2013.01)

(58) Field of Classification Search
CPC ........................... H01L 23/5226; H01L 25/00
USPC ........................................ 257/758, 774, 777
See application file for complete search history.

(56) References Cited

U.S. PATENT DOCUMENTS

| | | | |
|---|---|---|---|
| 7,176,506 B2* | 2/2007 | Beroz et al. ................. | 257/232 |
| 2007/0164418 A1* | 7/2007 | Brunnbauer ................. | 257/685 |
| 2010/0314736 A1* | 12/2010 | Ko et al. ..................... | 257/686 |
| 2011/0089561 A1* | 4/2011 | Kurita et al. ................ | 257/737 |
| 2011/0309496 A1* | 12/2011 | Wang et al. ................. | 257/737 |
| 2014/0120291 A1* | 5/2014 | Kim et al. ................... | 428/41.5 |

FOREIGN PATENT DOCUMENTS

| | | |
|---|---|---|
| KR | 10-2008-0069485 A | 7/2008 |
| KR | 10-2011-0048733 A | 5/2011 |

* cited by examiner

*Primary Examiner* — Cuong Q Nguyen
*Assistant Examiner* — Tong-Ho Kim

(57) ABSTRACT

An embedded package includes a first semiconductor chip embedded in a package substrate, a second semiconductor chip disposed over a first surface of the package substrate, and a group of external connection joints disposed on the first surface of the package substrate and between a sidewall of the second semiconductor chip and an edge of the embedded package. Related memory cards and related electronic systems are also provided.

7 Claims, 10 Drawing Sheets

EMBEDDED PACKAGES HAVING A CONNECTION JOINT GROUP

CROSS-REFERENCE TO RELATED APPLICATION

The present application claims priority under 35 U.S.C. 119(a) to Korean Application No. 10-2013-0161189, filed on Dec. 23, 2013, in the Korean Intellectual Property Office, which is incorporated herein by reference in its entirety.

BACKGROUND

1. Technical Field

Embodiments of the present disclosure relate to package technologies, and more particularly, to embedded packages having a connection joint group.

2. Related Art

As electronic systems such as smart phones become lighter and smaller, semiconductor packages employed in the electronic systems continue to be scaled down. In addition, a multi-functional semiconductor chip package or a large memory semiconductor package is increasingly in demand. Many attempts have been made to put a plurality of semiconductor chips in a single package in order to provide a larger memory package and multi-functional package, such as a multi-chip package.

Also, an embedded package has been proposed to reduce a thickness of the semiconductor package.

The embedded packages may include passive devices which are embedded in a substrate. Recently, in addition to passive devices, an active device such as a semiconductor chip has been embedded in the substrate. The active device embedded in the substrate may include an integrated circuit, such as a digital circuit or an analog circuit.

The active device embedded in the substrate of the embedded package may be a semiconductor chip. The embedded package may include a package substrate and connection joints disposed on the package substrate. The connection joints such as solder balls may be coupled to a module substrate to electrically connect the embedded package to the module substrate. The connection joints may be arrayed on the package substrate along a line having a rectangular shape. Various external stresses may be applied to the embedded packages, the resulting physical shocks may cause cracks in the connection joints.

SUMMARY

According to some embodiments, an embedded package includes a first semiconductor chip embedded in a package substrate, a second semiconductor chip mounted on a first surface of the package substrate, and a plurality of external connection joints disposed on the first surface of the package substrate to be spaced apart from a sidewall of the second semiconductor chip.

According to further embodiments, an embedded package includes a core layer having a cavity therein, a first semiconductor chip in the cavity, a first dielectric layer covering the core layer and the first semiconductor chip, a second semiconductor chip mounted on the first dielectric layer, a plurality of external connection joints disposed on the first dielectric layer to be spaced apart from a sidewall of the second semiconductor chip, and a second dielectric layer covering the second semiconductor chip.

According to further embodiments, an embedded package includes a plurality of first semiconductor chips mounted on a core layer, a first dielectric layer covering the core layer and the plurality of first semiconductor chips, a second semiconductor chip mounted on the first dielectric layer, a plurality of external connection joints disposed on the first dielectric layer to be spaced apart from a sidewall of the second semiconductor chip, and a second dielectric layer covering the second semiconductor chip.

According to further embodiments, a memory card includes an embedded package. The embedded package includes a first semiconductor chip embedded in a package substrate, a second semiconductor chip mounted on a first surface of the package substrate, and a plurality of external connection joints disposed on the first surface of the package substrate to be spaced apart from a sidewall of the second semiconductor chip.

According to further embodiments, a memory card includes an embedded package. The embedded package includes a core layer having a cavity therein, a first semiconductor chip in the cavity, a first dielectric layer covering the core layer and the first semiconductor chip, a second semiconductor chip mounted on the first dielectric layer, a plurality of external connection joints disposed on the first dielectric layer to be spaced apart from a sidewall of the second semiconductor chip, and a second dielectric layer covering the second semiconductor chip.

According to further embodiments, a memory card includes an embedded package. The embedded package includes a plurality of first semiconductor chips mounted on a core layer, a first dielectric layer covering the core layer and the plurality of first semiconductor chips, a second semiconductor chip mounted on the first dielectric layer, a plurality of external connection joints disposed on the first dielectric layer to be spaced apart from a sidewall of the second semiconductor chip, and a second dielectric layer covering the second semiconductor chip.

According to further embodiments, an electronic system includes an embedded package. The embedded package includes a first semiconductor chip embedded in a package substrate, a second semiconductor chip mounted on a first surface of the package substrate, and a plurality of external connection joints disposed on the first surface of the package substrate to be spaced apart from a sidewall of the second semiconductor chip.

According to further embodiments, an electronic system includes embedded package. The embedded package includes a core layer having a cavity therein, a first semiconductor chip in the cavity, a first dielectric layer covering the core layer and the first semiconductor chip, a second semiconductor chip mounted on the first dielectric layer, a plurality of external connection joints disposed on the first dielectric layer to be spaced apart from a sidewall of the second semiconductor chip, and a second dielectric layer covering the second semiconductor chip.

According to further embodiments, an electronic system includes an embedded package. The embedded package includes a plurality of first semiconductor chips mounted on a core layer, a first dielectric layer covering the core layer and the plurality of first semiconductor chips, a second semiconductor chip mounted on the first dielectric layer, a plurality of external connection joints disposed on the first dielectric layer to be spaced apart from a sidewall of the second semiconductor chip, and a second dielectric layer covering the second semiconductor chip.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings herein.

It will also be understood that when an element is referred to as being "on", "above", "below", or "under" another element, it can be directly "on", "above", "below" or "under" the other element, respectively, or intervening elements may also be present. Accordingly, the terms such as "on", "above", "below" or "under" which are used herein are for the purpose of describing particular embodiments only and are not intended to limit the disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion. A semiconductor substrate used herein may have an active layer corresponding to a region where transistors and internal interconnection lines constituting electronic circuits are integrated, and semiconductor chips may be obtained by separating the semiconductor substrate such as a wafer having the electronic circuits into a plurality of pieces using a die singulation process.

The semiconductor chips may correspond to memory chips, logic chips, analog chips, or chips combining the functions thereof. The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on and/or in the semiconductor substrate. The logic chips or analog chips may include logic circuits or analog circuits, respectively, which are integrated on and/or in the semiconductor substrate.

Figure 1:
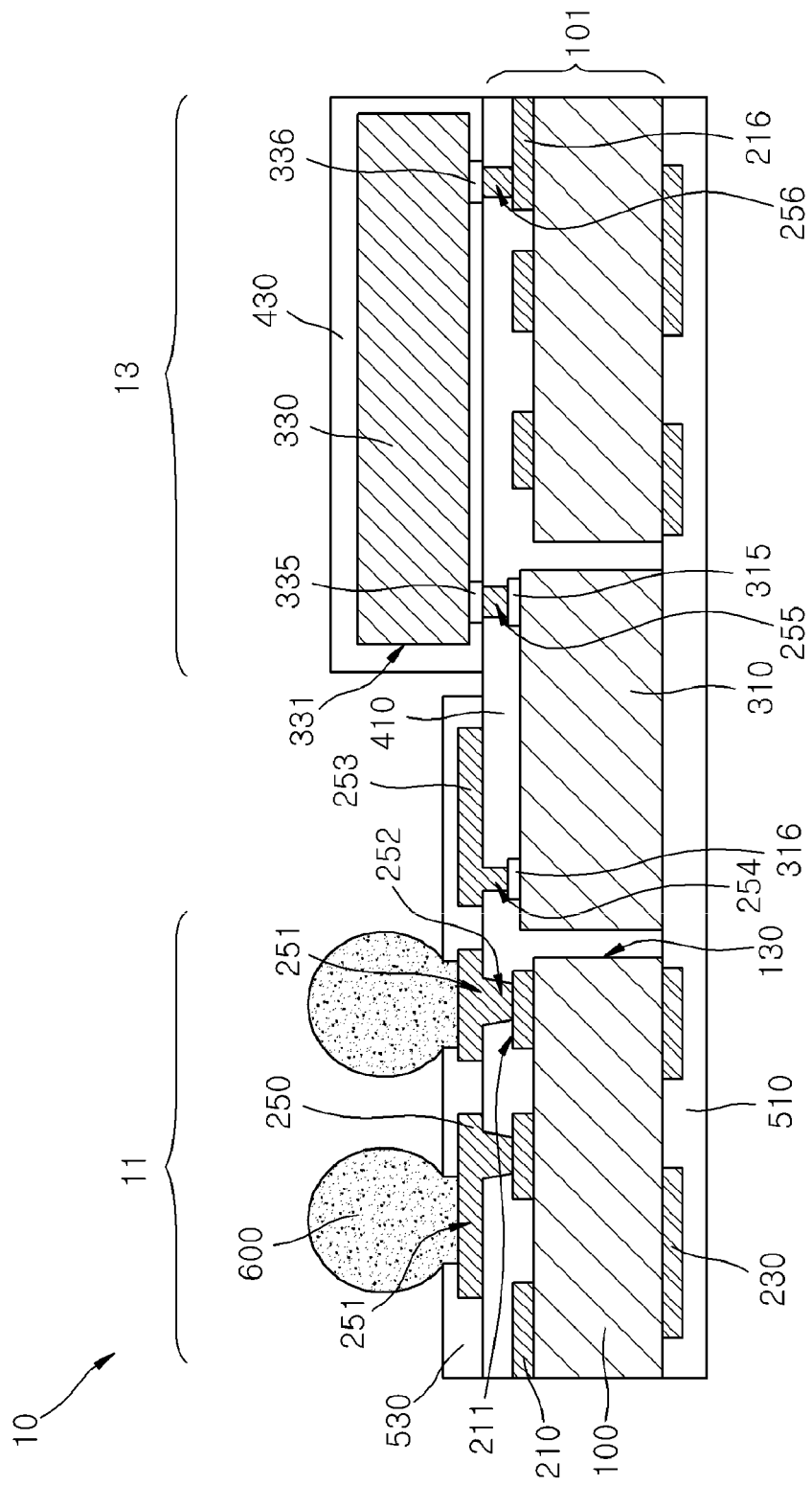
FIGS. 1 to 5 illustrate an embedded package according to an embodiment of the present application.
Figure 2:
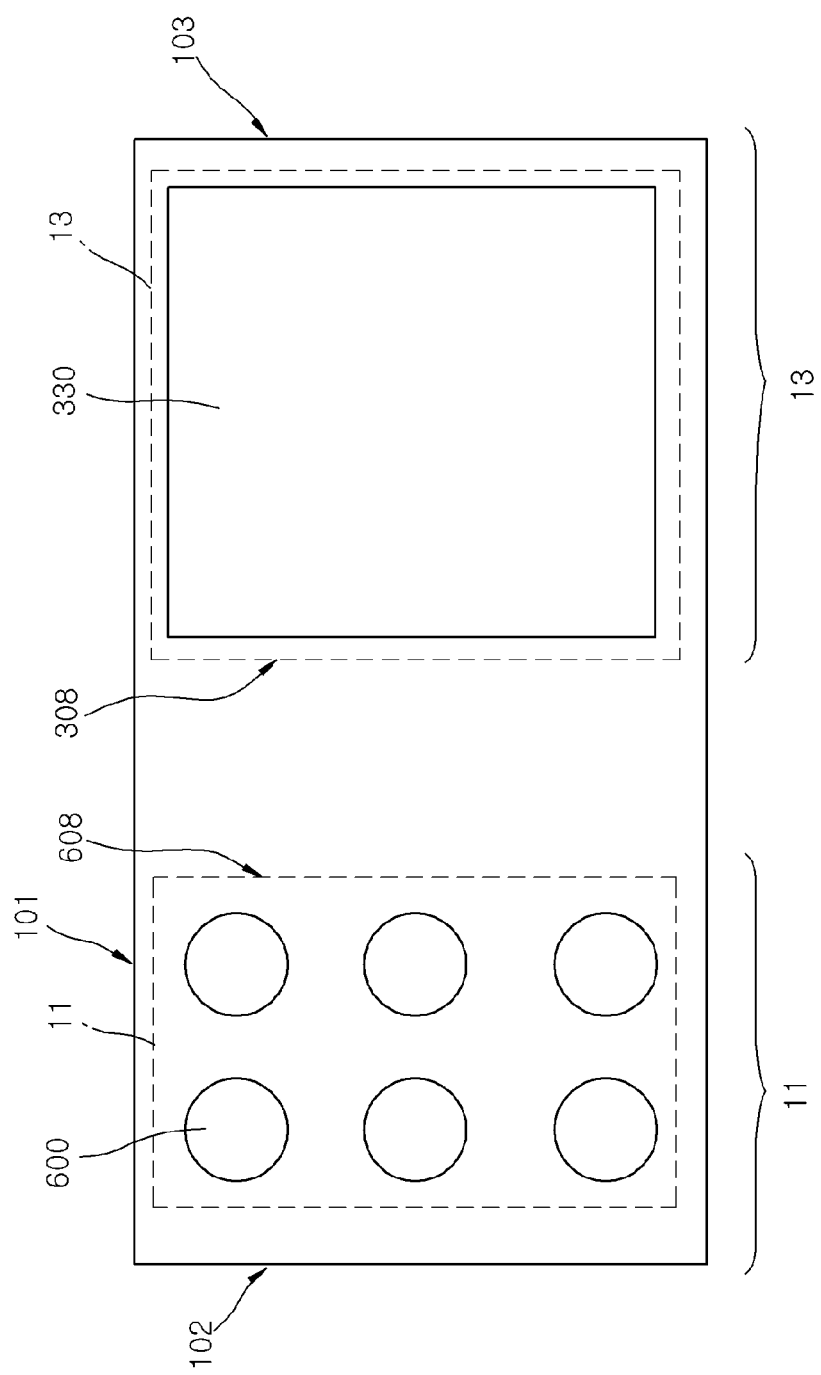
Figure 3:
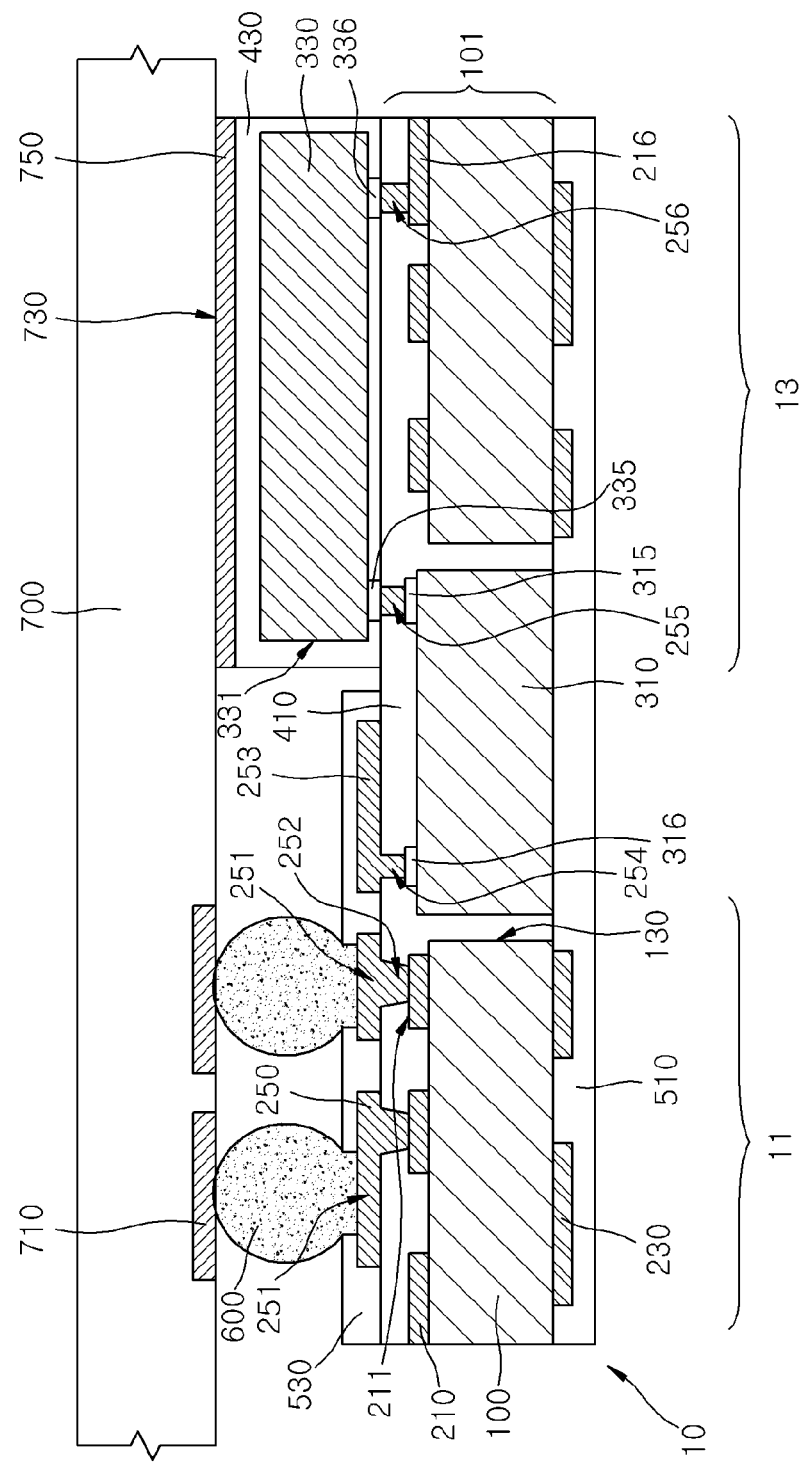
Figure 4:
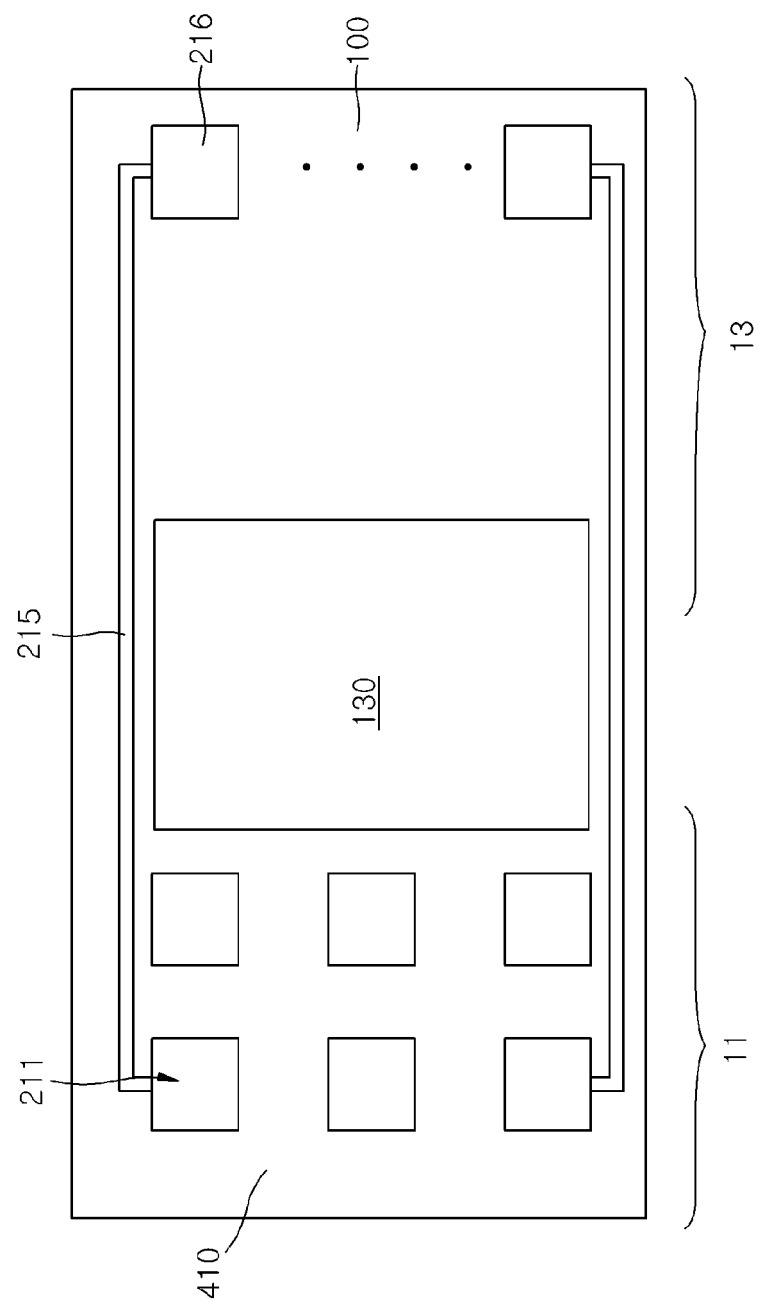
Figure 5:
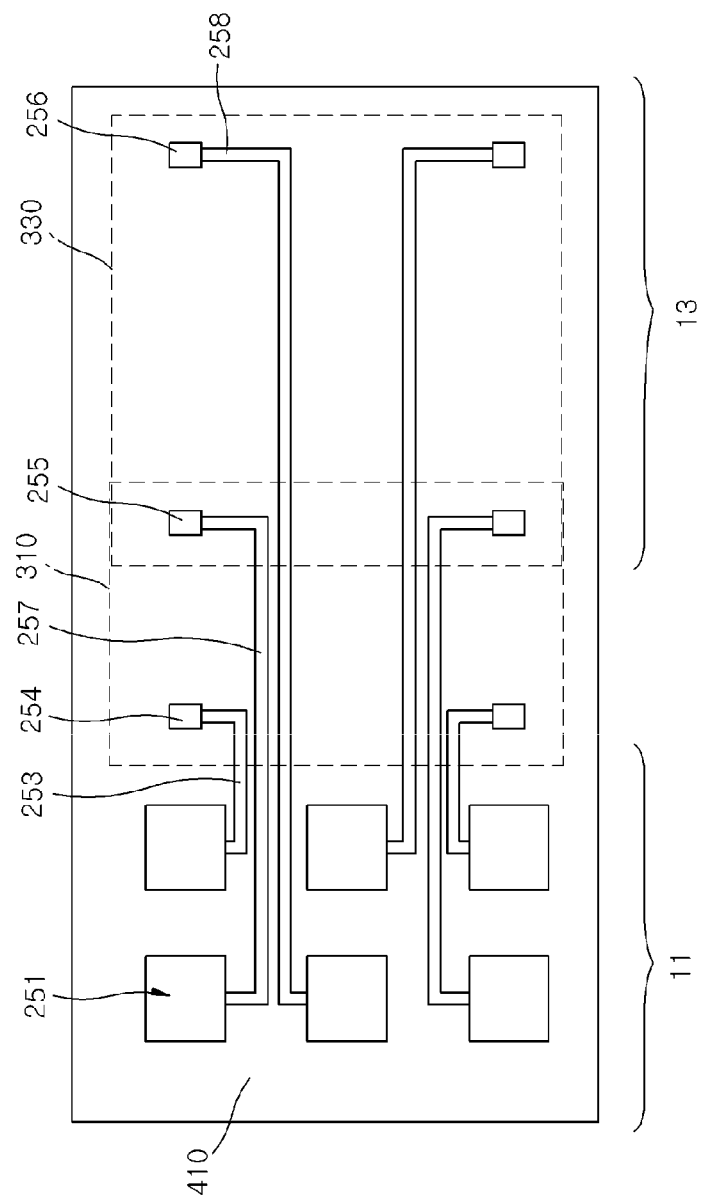

FIG. 1 is a cross-sectional view of an embedded package 10 according to an embodiment, and FIG. 2 is a plan view illustrating positions of external connection joints 600 of the embedded package 10. FIG. 3 is a cross-sectional view illustrating the embedded package 10 attached to a substrate 700. FIG. 4 is a plan view illustrating a circuit interconnection portion of the embedded package 10, and FIG. 5 is a plan view illustrating another circuit interconnection portion of the embedded package 10.

Referring to FIGS. 1, 2 and 3, the embedded package 10 may include a first semiconductor chip 310 embedded in a package substrate 101. A second semiconductor chip 330 is disposed over a first surface of the package substrate 101, and a plurality of external connection joints 600 are also disposed over the first surface of the package substrate 101. The external connection joints 600 may be solder balls, bumps, studs, and the like, and are configured to electrically and/or mechanically couple the embedded package 10 to an external device. Thus, in an embodiment, the embedded package 10 is disposed over a module substrate 700 (as shown in FIG. 3) or the like, and the external connection joints 600 may electrically couple the embedded package 10 to the module substrate 700 and/or may mechanically join the embedded package 10 with the module substrate 700.

The external connection joints 600 may be densely aggregated in one group and be disposed in a predetermined joint region 11 of the package substrate 100, which is adjacent to and spaced apart from a sidewall 331 of the second semiconductor chip 330. The second semiconductor chip 330 is disposed in a surface mount region 13 of the package substrate 101. The joint region 11 may have a first edge 608 located adjacent to a first edge 308 of the surface mount region 13.

One or more other edges of the surface mount region 13 may be located adjacent to corresponding edges of the package substrate 101, as illustrated in FIG. 2. For example, as illustrated in FIG. 2, the package substrate 101 may include a first edge 102 and a second edge 103 opposite the first edge 102, the joint region 11 may be adjacent to the first edge 102, and the surface mount region 13 may be adjacent to the second edge 103.

Thus, in an embodiment, the package substrate 101 includes a surface mount region 13, and further includes the joint region 11 disposed between the surface mount region 13 and the first edge 102 of the package substrate 101. The second semiconductor chip 330 is disposed over the first surface of the package substrate 101 within the surface mount region. The plurality of external connection joints 600, consisting of all of the external connection joints 600 of the embedded package 10 disposed on the first surface of the package substrate 101, are disposed in the joint region 11.

As described above, a local area adjacent to the first edge 102 of the package substrate 101 may be defined as the joint region 11, and the external connection joints 600 may be disposed only in the joint region 11. Thus, after the external connection joints 600 are combined with an external object such as the module substrate 700, the external connection joints 600 may exhibit improved endurance characteristics against physical shock, thermal stress or physical stress. The external connection joints 600 may be two-dimensionally arrayed in a plurality of rows and/or a plurality of columns in the joint region 11.

Since the external connection joints 600 are densely disposed in a local area such as the joint region 11, distances between the adjacent external connection joints 600 may be reduced compared to external connection joints arrayed on a loop line having a rectangular shape along all of four edges of the module substrate. Accordingly, the external connection joints 600 illustrated in FIGS. 1, 2 and 3 may exhibit an improved endurance characteristic against stresses, for example, a thermal stress, a physical stress and the like. That is, because any one external connection joint 600 has at least two external connection joints 600 disposed adjacent thereto, the one external connection joint 600 may not crack while enduring an external stress.

Because the formation of cracks on the external connection joints 600 is effectively suppressed, a pitch size of the external connection joints 600, that is, a distance between centers of adjacent external connection joints 600, can be reduced. In addition, because the external connection joints 600 are disposed only within the joint region 11 of the package substrate 101, at least one semiconductor chip, for example, at least one second semiconductor chip 330, may be disposed over the remaining area of the package substrate 101. Thus, at least two semiconductor chips, for example, the first and second semiconductor chips 310 and 330 may be disposed in and over the package substrate 101 to increase a package density of the embedded package 10.

Referring to FIGS. 1, 2 and 4, the package substrate 101 may include a core layer 100 such as an insulation layer in which a cavity 130 is located. The cavity 130 may be located, for example, in a central portion of the core layer 100. The cavity 130 may have a through hole shape penetrating the core layer 100 or a groove shape having a predetermined depth less than a thickness of the core layer 100. Thus, if the cavity 130 has a groove shape in the core layer 100, a portion of the core layer 100 may exist under the cavity 130. The cavity 130 may be located between the joint region 11 and the surface mount region 13.

The first semiconductor chip 310 may be disposed in the cavity 130 to be embedded in the core layer 100 or in the package substrate 101. When the cavity 130 penetrates the core layer 100, the first semiconductor chip 310 may be disposed in the cavity 130 by attaching the first semiconductor chip 310 to a carrier substrate (not shown) disposed under the core layer 100.

A first circuit interconnection portion 210 may be disposed on a first or front surface of the core layer 100 and a second circuit interconnection portion 230 may be disposed on a second or backside surface of the core layer 100 opposite to the front surface. The first and second circuit interconnection portions 210 and 230 may each include a conductive layer, such as a copper layer, formed of a plurality of conductive patterns. These first and second circuit interconnection portions 210 and 230 may be used to constitute electric circuits of the embedded package 10.

The first semiconductor chip 310 embedded in the cavity 130 may include first contact portions 315 and third contact portions 316 which are disposed on opposite ends of a surface of the first semiconductor chip 310. The first and third contact portions 315 and 316 may be used to electrically couple the first semiconductor chip 310 to other semiconductor chips and/or external devices. The first contact portions 315 may correspond to contact pads which are disposed adjacent to a first edge of the first semiconductor chip 310 and the third contact portions 316 may correspond to contact pads which are disposed adjacent to a second edge of the first semiconductor chip 310 opposite the first edge. In an embodiment, the first and third contact portions 315 and 316 may correspond to bumps. The first semiconductor chip 310 may be an individual semiconductor device which is obtained by separating a semiconductor substrate, such as a wafer, having the electronic circuits into a plurality of pieces using a die singulation process.

A first dielectric layer 410 may be disposed on the core layer 100 to embed the first semiconductor chip 310 in the package substrate 101. The first dielectric layer 410 may be formed to cover the core layer 100 and the first semiconductor chip 310 such that the first semiconductor chip 310 is fixed and protected in the cavity 130. The first dielectric layer 410 may be formed using a dielectric material such as an epoxy resin material or a build-up film.

The second semiconductor chip 330 may be disposed over a surface of the first dielectric layer 410 in the surface mount region 13. In an embodiment, the second semiconductor chip 330 may be a semiconductor chip having the same function or shape as the first semiconductor chip 310. In another embodiment, the second semiconductor chip 330 may be a semiconductor chip having a different function or a different shape from the first semiconductor chip 310. The second semiconductor chip 330 may be disposed such that a portion of the second semiconductor chip 330 overlaps with a portion of the first semiconductor chip 310 embedded under the first dielectric layer 410.

The second semiconductor chip 330 may include second contact portions 335 which are electrically coupled to the first contact portions 315 of the first semiconductor chip 310 and fourth contact portions 336 which are separated from the second contact portions 335. The second and fourth contact portions 335 and 336 may correspond to contact pads or bumps. The second semiconductor chip 330 may be disposed over the first dielectric layer 410 such that the second contact portions 335 of the second semiconductor chip 330 are vertically aligned with the first contact portions 315 of the first semiconductor chip 310. That is, the second semiconductor chip 330 may be a flip chip having a front surface facing the first dielectric layer 410 and stacked over the first dielectric layer 410 in a stepped configuration relative to the first semiconductor chip 310.

The embedded package 10 may include first internal contact portions 255 that electrically couple the first contact portions 315 of the first semiconductor chip 310 to the second contact portions 335 of the second semiconductor chip 330. The first internal contact portions 255 may constitute a circuit interconnection portion that electrically couples the first and second semiconductor chips 310 and 330 to the external connection joints 600. The second contact portions 335 may be electrically coupled to respective ones of the first contact portions 315 through the first internal contact portions 255. The first internal contact portions 255 may penetrate the first dielectric layer 410 to electrically couple the first and second contact portions 315 and 335 which are vertically aligned with each other. The first internal contact portions 255 may correspond to conductive via plugs or conductive bumps.

The first contact portions 315 may include output terminals of the first semiconductor chip 310 and may be electrically coupled to the second contact portions 335 of the second semiconductor chip 330. Thus, the first and second semiconductor chips 310 and 330 may be electrically coupled and may transmit electrical signals to each other.

A third circuit interconnection portion 250 may be disposed on the first dielectric layer 410 of the embedded package 10. The third circuit interconnection portion 250 may include a conductive layer, such as a copper layer, formed of a plurality of conductive patterns. The third circuit interconnection portion 250 may be formed using a plating process and an etch process. The third circuit interconnection portion 250 may include joint contact portions 251, fourth internal contact portions 252, and first circuit interconnection lines 253. The third circuit interconnection portion 250 may extend into the first dielectric layer 410 to electrically couple the first semiconductor chip 310 to the external connection joints 600. Each of the first circuit interconnection lines 253 may include a third internal contact portion 254 that penetrates the first dielectric layer 410 to contact one of the third contact portions 316 of the first semiconductor chip 310. The third internal contact portions 254 may include vertical extensions of portions of the first circuit interconnection lines 253, the extensions vertically penetrating the first dielectric layer 410. The third internal contact portions 254 may include conductive via plugs or conductive bumps.

To electrically couple the fourth contact portions 336 of the second semiconductor chip 330 to the external connection joints 600, second internal contact portions 256 may be disposed in the first dielectric layer 410. The second internal contact portions 256 may electrically couple second circuit interconnection contact patterns 216 constituting the first circuit interconnection portion 210 to the fourth contact portions 336. The second internal contact portions 256 may include conductive via plugs or conductive bumps that penetrate the first dielectric layer 410. The second circuit interconnection contact patterns 216 may be electrically coupled to the external connection joints 600 through the first circuit interconnection portion 210. That is, the second circuit interconnection contact patterns 216 may constitute a portion of an electrical signal path that electrically couples the second semiconductor chip 330 to the external connection joints 600.

Joint contact portions 251 may be conductive patterns on which the external connection joints 600 are disposed. Thus, the joint contact portions 251 may be located in the joint region 11. To electrically couple the joint contact portions 251 to interconnection contact portions 211 constituting the first circuit interconnection portion 210 disposed on a front surface of the core layer 100 under the first dielectric layer 410, fourth internal contact portions 252 may be disposed to vertically penetrate the first dielectric layer 410. The fourth internal contact portions 252 may include vertical extensions of portions of the joint contact portions 251, the extensions vertically penetrating the first dielectric layer 410. The fourth internal contact portions 252 may include conductive via plugs or conductive bumps.

The joint contact portions 251, the first circuit interconnection lines 253, the first internal contact portions 255, the second internal contact portions 256, the third internal contact portions 254 and the fourth internal contact portions 252 may constitute the third circuit interconnection portion 250. Therefore, the joint contact portions 251, the first circuit interconnection lines 253, the first internal contact portions 255, the second internal contact portions 256, the third internal contact portions 254 and the fourth internal contact portions 252 may be formed using one or more processes used in formation of the third circuit interconnection portion 250, including one or more of a via hole formation process, a seed layer formation process, a plating process, and an etch process.

A first protection layer 510 may cover the second circuit interconnection portion 230 to physically protect and electrically insulate the second circuit interconnection portion 230 from the external environment. Further, a second protection layer 530 may be disposed on the first dielectric layer 410 to cover the third circuit interconnection portion 250 except that the joint contact portions 251 may be exposed by the second protection layer 530. The first and second protection layers 510 and 530 may include a solder resist layer. The second protection layer 530 may be disposed to expose the first dielectric layer 410 in the surface mount region 13. The external connection joints 600 may be attached to the joint contact portions 251 exposed by the second protection layer 530.

The embedded package 10 may further include a second dielectric layer 430 disposed over and around the second semiconductor chip 330. The second dielectric layer 430 may be disposed over the first dielectric layer 410 to cover and protect the second semiconductor chip 330 from an external environment.

Referring again to FIGS. 1 and 3, the external connection joints 600 may be densely aggregated in the joint region 11. The second semiconductor chip 330 may be disposed in the surface mount region 13 which is disposed at an opposite end of the package substrate 101 relative to the joint region 11. Thus, the embedded package 10 may be balanced, so that the embedded package 10 may be mounted to module substrate 700 with the package substrate 101 disposed substantially parallel to the module substrate 700.

As illustrated in FIG. 3, when the embedded package 10 is disposed over an external member such as a module substrate 700, the external connection joints 600 join to module contact portions 710 of the module substrate 700 only on a local area of the module substrate 700. Thus, because no structure shown in FIG. 1 in the surface mount region 13 of the embedded package 10 has a same height as the external connection joints 600, the embedded package 10 may be unbalanced on the module substrate 700. To remedy this unbalance of the embedded package 10, an adhesive layer 750 may be disposed between the second dielectric layer 430 covering the second semiconductor chip 330 and a contact portion 730 of the module substrate 700. The adhesive layer 750 may attach the surface mount region 13 including the second semiconductor chip 330 to the module substrate 700 to balance the embedded package 10. In addition, the adhesive layer 750 may increase the adhesion between the module substrate 700 and the embedded package 10.

FIG. 4 illustrates a plan view of portions of the first circuit interconnection portion 210 shown disposed on the core layer 100 in FIG. 1, specifically, the interconnection contact portions 211, second circuit interconnection contact patterns 216, and third circuit interconnection lines 215. The interconnection contact portions 211 may be electrically coupled to the joint contact portions 251 through the fourth internal contact portions 252 and to the external connection joints 600 through the third circuit interconnection portion 250.

The interconnection contact portions 211 may be electrically coupled through third circuit interconnection lines 215 to the second circuit interconnection contact patterns 216, which are coupled to the fourth contact portions 336 of the second semiconductor chip 330. The third circuit interconnection lines 215 may be disposed on the core layer 100 and may detour around the cavity 130. Thus, the second semiconductor chip 330 may be electrically coupled to the external connection joints 600 through the detour path including the third circuit interconnection lines 215.

FIG. 5 illustrates a plan view of portions of the third circuit interconnection portion 250 shown disposed on the first dielectric layer 410 in FIG. 1, specifically, the joint contact portions 251, the first, second, and third internal contact portions 255, 256, and 254, and the first, fourth, and fifth circuit interconnection lines 253, 258 and 257. The joint contact portions 251 may be electrically coupled to the second internal contact portions 256, which are coupled to the fourth contact portions 336 of the second semiconductor chip 330, through fourth circuit interconnection lines 258. The fourth circuit interconnection lines 258 may be disposed having line shapes that extend from the surface mount region 13 into the joint region 11. Both the fourth circuit interconnection lines 258 and the third circuit interconnection 215 may couple second semiconductor chip 330 to an external connection joint 600. Thus, embodiments may include one or the other or both of the fourth circuit interconnection lines 258 and the third circuit interconnection lines 215 shown in FIG. 4. In another embodiment, third circuit interconnection lines 215 shown in FIG. 4 may be omitted and the fourth circuit interconnection lines 258 used in their place.

The embedded package 10 may further include fifth circuit interconnection lines 257 disposed on the first dielectric layer 410. The fifth circuit interconnection lines 257 may electrically couple the first internal contact portions 255, which couple the second contact portions 335 of the second semiconductor chip 330 to the first contact portions 315 of the first semiconductor chip 310, to the joint contact portions 251. The first circuit interconnection lines 253 may have line shapes which are parallel with the fourth and fifth circuit interconnection lines 258 and 257. Because the first, fourth and fifth circuit interconnection lines 253, 258 and 257 are disposed on the first dielectric layer 410, the first, fourth and fifth circuit interconnection lines 253, 258 and 257 may be disposed to cross over the cavity 130 when viewed from a plan view.

As illustrated in FIGS. 1, 4 and 5, the first circuit interconnection portion 210 and the third circuit interconnection portion 250 may contact opposing surfaces of the first dielectric layer 410. Thus, the first and third circuit interconnection portions 210 and 250 may constitute a multi-layered interconnection structure. As a result, the external connection joints 600 locally disposed in the joint region 11, the electrical interconnection lines coupled to the first semiconductor chip 310, and the second semiconductor chip 330 may be efficiently disposed.

Figure 6:
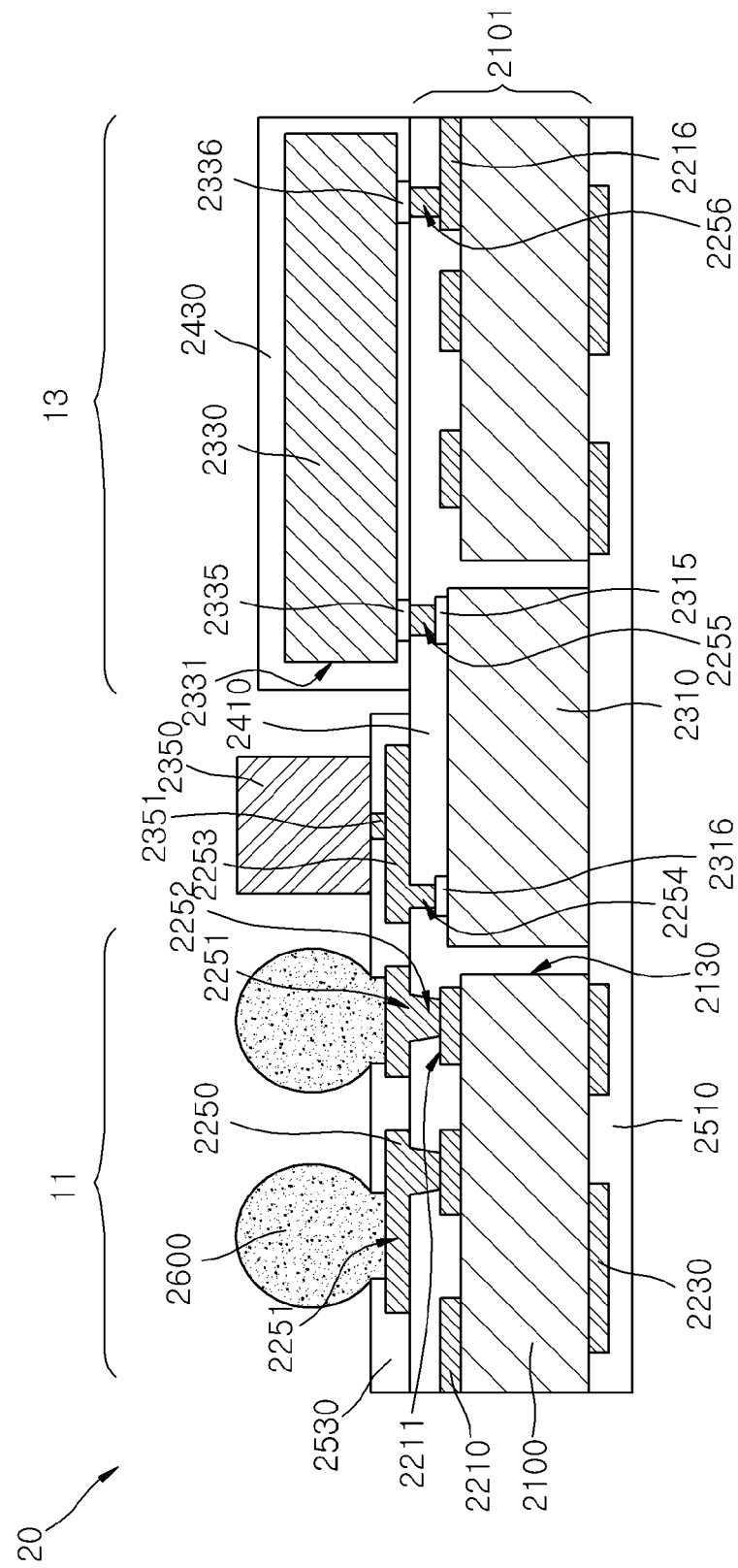
FIGS. 6 to 9 are cross-sectional views illustrating embedded packages according to embodiments.

FIG. 6 is a cross-sectional view illustrating an embedded package 20 according to an embodiment. The embedded package 20 may include a package substrate 2101 and a first semiconductor chip 2310 embedded in the package substrate 2101. A second semiconductor chip 2330 may be disposed over a first surface of the package substrate 2101, and external connection joints 2600 may also be disposed over the first surface of the package substrate 2101. The external connection joints 2600 may include solder balls, bumps, studs, and the like, and may be densely disposed in a predetermined joint region 11 which is spaced apart from a sidewall 2331 of the second semiconductor chip 2330.

The package substrate 2101 may include a core layer 2100, such as an insulation layer, in which a cavity 2130 is located. The cavity 2130 may be located, for example, in a central portion of the core layer 2100. The first semiconductor chip 2310 may be disposed in the cavity 2130 so as to embed the first semiconductor chip 2310 in the core layer 2100 or in the package substrate 2101. A first circuit interconnection portion 2210 may be disposed on a first or front surface of the core layer 2100 and a second circuit interconnection portion 2230 may be disposed on a second or backside surface of the core layer 2100 opposite to the front surface. The first semiconductor chip 2310 embedded in the cavity 2130 may include first contact portions 2315 and third contact portions 2316 which are disposed on a surface thereof and at opposite ends of the first semiconductor chip 2310 to each other.

The front surface of the core layer 2100 may be coated by a first dielectric layer 2410, and the second semiconductor chip 2330 may be disposed over a surface of the first dielectric layer 2410 in a surface mount region 13. The second semiconductor chip 2330 may be disposed such that a portion of the second semiconductor chip 2330 overlaps with a portion of the first semiconductor chip 2310 embedded under the first dielectric layer 2410.

In an embodiment, the second semiconductor chip 2330 may include second contact portions 2335 which are electrically coupled to the first contact portions 2315 of the first semiconductor chip 2310 and fourth contact portions 2336 which are separated from the second contact portions 2335. The second semiconductor chip 2330 may be disposed over the first dielectric layer 2410 such that the second contact portions 2335 of the second semiconductor chip 2330 are vertically aligned with the first contact portions 2315 of the first semiconductor chip 2310.

The embedded package 20 may include first internal contact portions 2255 that electrically couple the first contact portions 2315 to the second contact portions 2335. The first internal contact portions 2255 may constitute a circuit interconnection portion that electrically couples the first and second semiconductor chips 2310 and 2330 to the external connection joints 2600. The second contact portions 2335 may be electrically coupled to respective ones of the first contact portions 2315 through the first internal contact portions 2255. The first internal contact portions 2255 may vertically penetrate the first dielectric layer 2410. The first contact portions 2315 may be output terminals of the first semiconductor chip 2310 and may be electrically coupled to the second contact portions 2335 of the second semiconductor chip 2330.

A third circuit interconnection portion 2250 may be disposed on the first dielectric layer 2410 of the embedded package 20. The third circuit interconnection portion 2250 may extend into the first dielectric layer 2410 to electrically couple the first semiconductor chip 2310 to the external connection joints 2600. The third circuit interconnection portion 2250 may include first circuit interconnection lines 2253, and each of the first circuit interconnection lines 2253 may include a third internal contact portion 2254 that penetrates the first dielectric layer 2410 to contact one of the third contact portions 2316 of the first semiconductor chip 2310.

To electrically couple the fourth contact portions 2336 of the second semiconductor chip 2330 to the external connection joints 2600, second internal contact portions 2256 may be disposed in the first dielectric layer 2410. The second internal contact portions 2256 may electrically couple second circuit interconnection contact patterns 2216 constituting the first circuit interconnection portion 2210 to the fourth contact portions 2336. The second circuit interconnection contact patterns 2216 coupled to the second internal contact portions 2256 may be electrically coupled to the external connection joints 2600 through the first circuit interconnection portion 2210. That is, the second circuit interconnection contact patterns 2216 may constitute a portion of an electrical signal path that electrically couples the second semiconductor chip 2330 to the external connection joints 2600.

Joint contact portions 2251 constituting the third circuit interconnection portion 2250 may be conductive patterns on which the external connection joints 2600 are disposed. To electrically couple the joint contact portions 2251 to interconnection contact portions 2211 constituting the first circuit interconnection portion 2210 disposed on a front surface of the core layer 2100 under the first dielectric layer 2410, fourth internal contact portions 2252 may be disposed to vertically penetrate the first dielectric layer 2410.

A first protection layer 2510 may cover the second circuit interconnection portion 2230 in order to physically protect and electrically insulate the second circuit interconnection portion 2230 from the external environment. Further, a second protection layer 2530 may be disposed on the first dielectric layer 2410 to cover the third circuit interconnection portion 2250 except that the joint contact portions 2251 may be exposed by the second protection layer 2530. The embedded package 20 may further include a second dielectric layer 2430 covering the second semiconductor chip 2330.

A third semiconductor chip 2350 may be additionally disposed over the second protection layer 2530 between the second semiconductor chip 2330 and the external connection joints 2600. The third semiconductor chip 2350 may be encapsulated by a molding layer (not shown) such as an epoxy molding compound (EMC) layer. The third semiconductor chip 2350 may be electrically coupled to the third circuit interconnection portion 2250 through contact portions 2351 penetrating the second protection layer 2530. The third semiconductor chip 2350 may be a chip including passive elements such as capacitors or a logic chip such as a controller.

The third semiconductor chip 2350 may have a size which is smaller than that of the second semiconductor chip 2330. Therefore, the third semiconductor chip 2350 may be disposed in a relatively narrow space between the second semiconductor chip 2330 and the external connection joints 2600.

Figure 7:
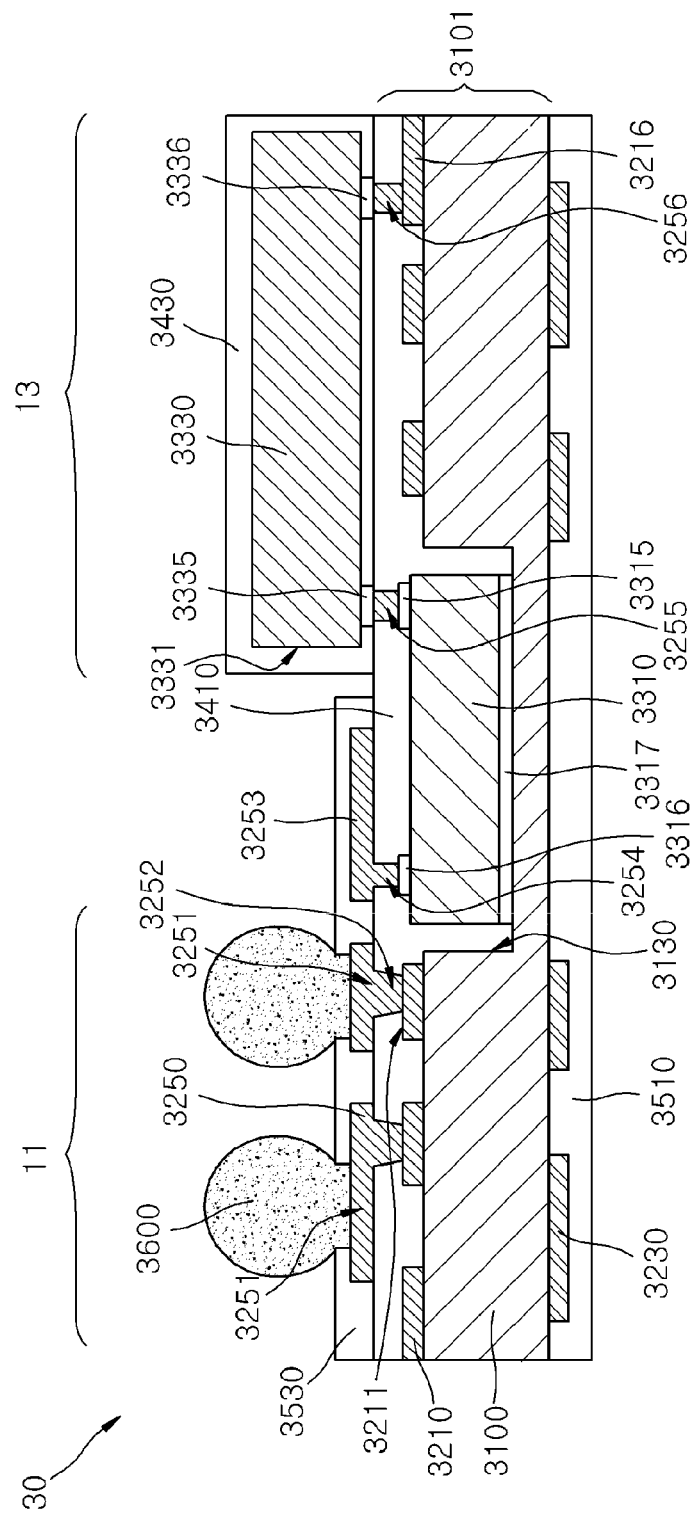

FIG. 7 is a cross-sectional view illustrating an embedded package 30 according to an embodiment. The embedded package 30 may include a package substrate 3101 and a first semiconductor chip 3310 embedded in the package substrate 3101. A second semiconductor chip 3330 may be disposed over a first surface of the package substrate 3101, and external connection joints 3600 may also be disposed on the first surface of the package substrate 3101. The external connection joints 3600 may include solder balls, bumps, stud, and the like, and may be densely disposed in a predetermined joint region 11 which is adjacent to and spaced apart from a sidewall 3331 of the second semiconductor chip 3330.

The package substrate 3101 may include a core layer 3100, such as an insulation layer, in which a cavity 3130 is located. The cavity 3130 may be located in a central portion of the core layer 3100. The cavity 3130 may have a half cavity shape, that is, the cavity 3130 may be a groove or rectangular hole having a predetermined depth less than a thickness of the core layer 3100. Thus, a portion of the core layer 3100 may exist under the cavity 3130.

The first semiconductor chip 3310 may be disposed in the cavity 3130 so as to be embedded in the core layer 3100 or in the package substrate 3101. A bottom adhesive layer 3317 such as a WBL film or an epoxy adhesive layer may be introduced between the first semiconductor chip 3310 and a bottom surface of the cavity 3130 to fix the first semiconductor chip 3310 in the cavity 3130.

A first circuit interconnection portion 3210 may be disposed on a first surface (a front surface) of the core layer 3100 and a second circuit interconnection portion 3230 may be disposed on a second surface (a backside surface) of the core layer 3100 opposite to the front surface. The first semiconductor chip 3310 embedded in the cavity 3130 may include first contact portions 3315 and third contact portions 3316 which are disposed on a surface thereof, and the first contact portions 3315 may be disposed at an opposite end of the first semiconductor chip 3310 relative to the third contact portions 3316.

A first dielectric layer 3410 may be disposed over the core layer 3100, and the second semiconductor chip 3330 may be disposed over a surface of the first dielectric layer 3410 in a surface mount region 13. The second semiconductor chip 3330 may be disposed such that a portion of the second semiconductor chip 3330 overlaps with a portion of the first semiconductor chip 3310 embedded under the first dielectric layer 3410.

In an embodiment, the second semiconductor chip 3330 may include second contact portions 3335 which are electrically coupled to the first contact portions 3315 of the first semiconductor chip 3310 and fourth contact portions 3336 which are separated from the second contact portions 3335. The second semiconductor chip 3330 may be disposed over the first dielectric layer 3410 such that the second contact portions 3335 of the second semiconductor chip 3330 are vertically aligned with the first contact portions 3315 of the first semiconductor chip 3310.

The embedded package 30 may include first internal contact portions 3255 that electrically couples the first contact portions 3315 to the second contact portions 3335. The first internal contact portions 3255 may constitute a circuit interconnection portion that electrically couple the first and second semiconductor chips 3310 and 3330 to the external connection joints 3600. The second contact portions 3335 may be electrically coupled to respective ones of the first contact portions 3315 through the first internal contact portions 3255. The first internal contact portions 3255 may be disposed to vertically penetrate the first dielectric layer 3410. The first contact portions 3315 may be output terminals of the first semiconductor chip 3310 and may be electrically coupled to the second contact portions 3335 of the second semiconductor chip 3330.

A third circuit interconnection portion 3250 may be disposed on the first dielectric layer 3410 of the embedded package 30. The third circuit interconnection portion 3250 may extend into the first dielectric layer 3410 to electrically couple the first semiconductor chip 3310 to the external connection joints 3600. The third circuit interconnection portion 3250 may include first circuit interconnection lines 3253, and each of the first circuit interconnection lines 3253 may include a third internal contact portion 3254 that penetrates the first dielectric layer 3410 to contact one of the third contact portions 3316 of the first semiconductor chip 3310.

To electrically couple the fourth contact portions 3336 of the second semiconductor chip 3330 to the external connection joints 3600, second internal contact portions 3256 may be disposed in the first dielectric layer 3410. The second internal contact portions 3256 may electrically couple second circuit interconnection contact patterns 3216 constituting the first circuit interconnection portion 3210 to the fourth contact portions 3336. The second circuit interconnection contact patterns 3216 coupled to the second internal contact portions 3256 may be electrically coupled to the external connection joints 3600 through the first circuit interconnection portion 3210. That is, the second circuit interconnection contact patterns 3216 may constitute a portion of an electrical signal path that electrically couples the second semiconductor chip 3330 to the external connection joints 3600.

Joint contact portions 3251 constituting the third circuit interconnection portion 3250 may be conductive patterns on which the external connection joints 3600 are disposed. To electrically couple the joint contact portions 3251 to interconnection contact portions 3211 constituting the first circuit interconnection portion 3210 disposed on a front surface of the core layer 3100 under the first dielectric layer 3410, fourth internal contact portions 3252 may be disposed to vertically penetrate the first dielectric layer 3410.

A first protection layer 3510 may cover the second circuit interconnection portion 3230 to physically protect and electrically insulate the second circuit interconnection portion 3230 from the external environment. Further, a second protection layer 3530 may be disposed on the first dielectric layer 3410 to cover the third circuit interconnection portion 3250 except that the joint contact portions 3251 may be exposed by the second protection layer 3530. The embedded package 30 may further include a second dielectric layer 3430 covering the second semiconductor chip 3330.

Figure 8:
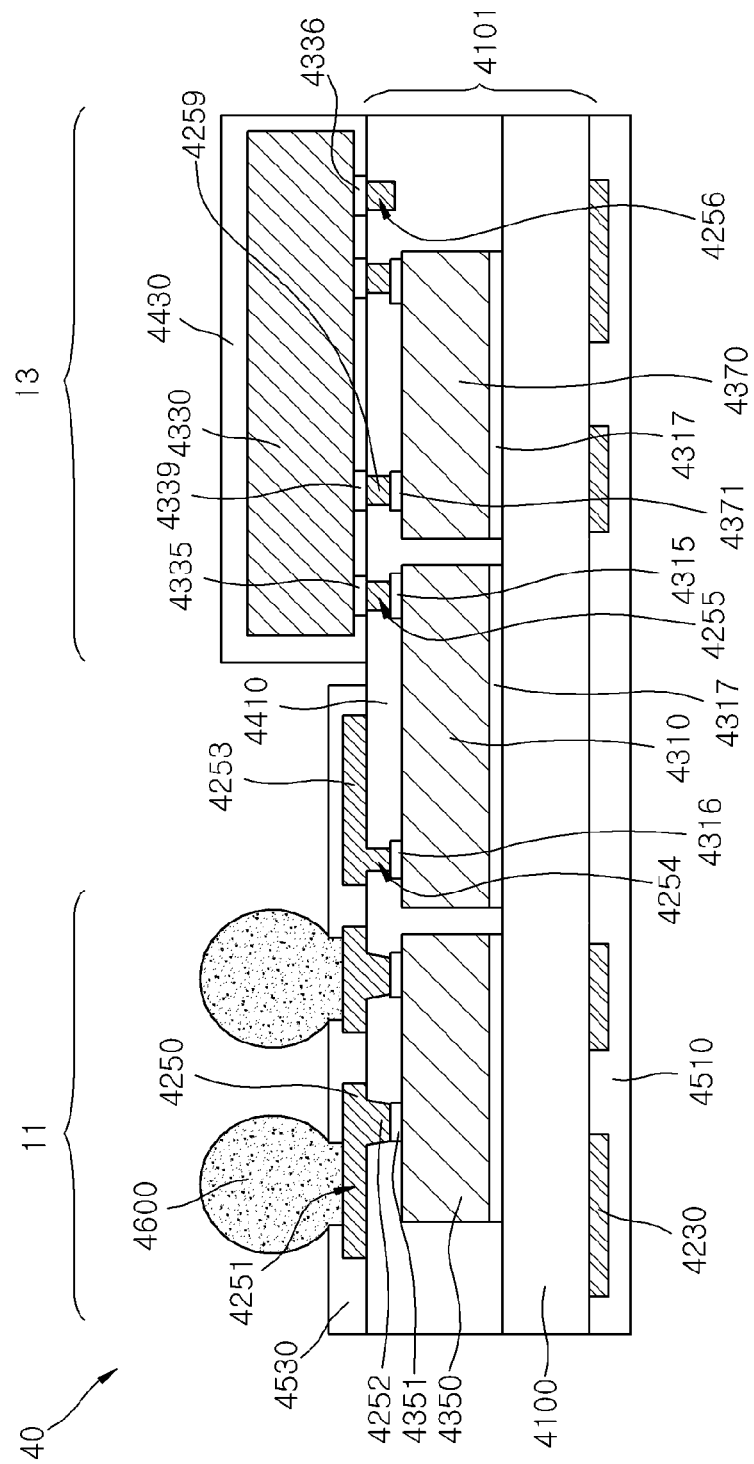

FIG. 8 is a cross-sectional view illustrating an embedded package 40 according to an embodiment. The embedded package 40 includes a package substrate 4101 and a plurality of first semiconductor chips 4310, 4350 and 4370 embedded in the package substrate 4101. A second semiconductor chip 4330 may be disposed over a first surface of the package substrate 4101, and external connection joints 4600 may also be disposed on the first surface of the package substrate 4101. The external connection joints 4600 may include solder balls, bumps, studs, and the like, and may be densely disposed in a predetermined joint region 11 which is adjacent to and spaced apart from a sidewall of the second semiconductor chip 4330.

The package substrate 4101 may include a core layer 4100 and a first dielectric layer 4410. The first semiconductor chips 4310, 4350 and 4370 may be disposed on a first surface of the core layer 4100, and the first dielectric layer 4410 may be disposed over the first surface of the core layer 4100 to cover the first semiconductor chips 4310, 4350 and 4370. The first semiconductor chips 4310, 4350 and 4370 may be attached to the core layer 4100 using a bottom adhesive layer 4317 disposed between the first semiconductor chips 4310, 4350 and 4370 and the core layer 4100. The plurality of first semiconductor chips 4310, 4350 and 4370 may be disposed over the core layer 4100 because no cavity is present in the core layer 4100. A first circuit interconnection portion 4230 may be disposed on a second surface (a backside surface) of the core layer 4100 opposite to the first surface of the core layer 4100.

The second semiconductor chip 4330 may be disposed such that a portion of the second semiconductor chip 4330 overlaps with a portion of one or more of the first semiconductor chips 4310, 4350 and 4370 embedded under the first dielectric layer 4410.

The first semiconductor chip 4310 may include first contact portions 4315 disposed on a front surface thereof and third contact portions 4316 disposed on the front surface at an opposite end relative to the first contact portions 4315. The second semiconductor chip 4330 may include second contact portions 4335 which are electrically coupled to the first contact portions 4315 of the first semiconductor chip 4310 and fourth contact portions 4336 which are at an opposite end relative to and separated from the second contact portions 4335. The second semiconductor chip 4330 may be disposed over the first dielectric layer 4410 such that the second contact portions 4335 of the second semiconductor chip 4330 are vertically aligned with the first contact portions 4315 of the first semiconductor chip 4310.

The embedded package 40 may include first internal contact portions 4255 that electrically couple the first contact portions 4315 to the second contact portions 4335. The first internal contact portions 4255 may constitute a circuit interconnection portion that electrically couples the first and second semiconductor chips 4310 and 4330 to the external connection joints 4600. The second contact portions 4335 may be electrically coupled to respective ones of the first contact portions 4315 through the first internal contact portions 4255. The first internal contact portions 4255 may be disposed to vertically penetrate the first dielectric layer 4410. The first contact portions 4315 may be output terminals of the first semiconductor chip 4310 and may be electrically coupled to the second contact portions 4335 of the second semiconductor chip 4330.

A second circuit interconnection portion 4250 may be disposed on the first dielectric layer 4410 of the embedded package 40. The second circuit interconnection portion 4250 may extend into the first dielectric layer 4410 to electrically couple the first semiconductor chip 4310 to the external connection joints 4600. The second circuit interconnection portion 4250 may include first circuit interconnection lines 4253, and each of the first circuit interconnection lines 4253 may include a third internal contact portion 4254 that penetrates the first dielectric layer 4410 to contact one of the third contact portions 4316 of the first semiconductor chip 4310.

To electrically couple the fourth contact portions 4336 of the second semiconductor chip 4330 to the external connection joints 4600, second internal contact portions 4256 may be disposed in the first dielectric layer 4410. The second internal contact portions 4256 may be electrically coupled to the fourth contact portions 4336 of the second semiconductor chip 4330. The second internal contact portions 4256 may be electrically coupled to the external connection joints 4600 through the second circuit interconnection portion 4250. That is, the second internal contact portions 4256 may be a portion of an electric signal path that electrically couples the second semiconductor chip 4330 to the external connection joints 4600.

Joint contact portions 4251 constituting the third circuit interconnection portion 4250 may be conductive patterns on which the external connection joints 4600 are disposed. To electrically couple the joint contact portions 4251 to fifth contact portions 4351 of the first semiconductor chip 4350 disposed on a front surface of the core layer 4100 under the first dielectric layer 4410, fourth internal contact portions 4252 may be disposed to vertically penetrate the first dielectric layer 4410. In an embodiment, the first semiconductor chip 4350 is disposed under the external connection joints 4600 to overlap with the external connection joints 4600.

Moreover, the first semiconductor chip 4370 may be disposed under the second semiconductor chip 4330 to overlap with the second semiconductor chip 4330. The first semiconductor chip 4370 may include sixth contact portions 4371 disposed on a surface thereof, and the sixth contact portions 4371 may be electrically coupled to seventh contact portions 4339 of the second semiconductor chip 4330 through fifth internal contact portions 4259 vertically penetrating the first dielectric layer 4410.

A first protection layer 4510 may cover the first circuit interconnection portion 4230 to physically protect and electrically insulate the first circuit interconnection portion 4230 from the external environment. Further, a second protection layer 4530 may be disposed on the first dielectric layer 4410 to cover the second circuit interconnection portion 4250, except the joint contact portions 4251 may be exposed by the second protection layer 4530. The embedded package 40 may further include a second dielectric layer 4430 covering the second semiconductor chip 4330. Although not shown in FIG. 8, a third semiconductor chip 2350 described with reference to FIG. 6 may be additionally disposed on the second protection layer 4530 between the second semiconductor chip 4330 and the external connection joints 4600.

Figure 9:
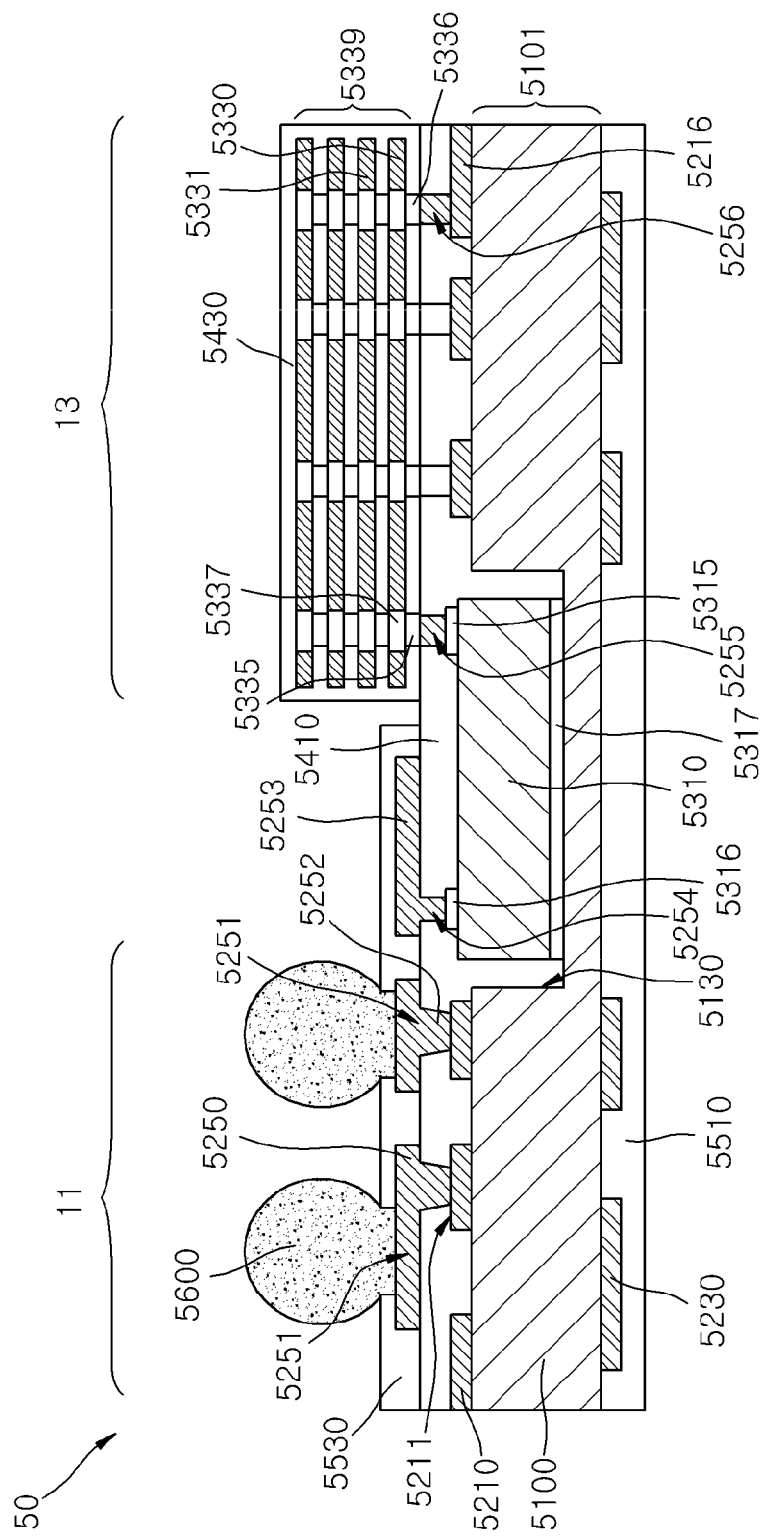

FIG. 9 is a cross-sectional view illustrating an embedded package 50 according to an embodiment. The embedded package 50 includes a package substrate 5101 and a first semiconductor chip 5310 embedded in the package substrate 5101. A second semiconductor chip 5330 is disposed over a first surface of the package substrate 5101, and external connection joints 5600 are also disposed on the first surface of the package substrate 5101. The external connection joints 5600 may include solder balls, bumps, studs, and the like, and may be densely disposed in a predetermined joint region 11 which is adjacent to and spaced apart from a sidewall of the second semiconductor chip 5330.

One or more third semiconductor chips 5331 may be stacked on the second semiconductor chip 5330, and the second and third semiconductor chips 5330 and 5331 may constitute a stack structure 5339. The second and third semiconductor chips 5330 and 5331 may be electrically coupled to each other via through electrodes 5337, which in an embodiment are through silicon vias (TSVs). In an embodiment, the second and third semiconductor chips 5330 and 5331 have the same function and configuration. In another embodiment, at least one of the second and third semiconductor chips 5330 and 5331 may have a different function and configuration from the other.

The package substrate 5101 may include a core layer 5100, such as an insulation layer, in which a cavity 5130 is formed. The cavity 5130 may be formed in a central portion of the core layer 5100. The cavity 5130 may have a half cavity shape, that is, the cavity 5130 may be a groove or rectangular hole having a predetermined depth less than a thickness of the core layer 5100. Thus, a portion of the core layer 5100 may exist under the cavity 5130.

The first semiconductor chip 5310 may be disposed in the cavity 5130 so as to be embedded in the core layer 5100 or in the package substrate 5101. A bottom adhesive layer 5317, such as a WBL film or an epoxy adhesive layer, may be formed between the first semiconductor chip 5310 and a bottom surface of the cavity 5130 to fix the first semiconductor chip 5310 in the cavity 5130. A first circuit interconnection portion 5210 may be disposed on a first or front surface of the core layer 5100 and a second circuit interconnection portion 5230 may be disposed on a second or backside surface of the core layer 5100 opposite the front surface. The first semiconductor chip 5310 embedded in the cavity 5130 may include first contact portions 5315 and third contact portions 5316 which are disposed on a surface thereof, and the first contact portions 5315 may be disposed on an opposite end of the first semiconductor chip 5310 relative to the third contact portions 5316.

A first dielectric layer 5410 may be disposed over the core layer 5100, and the second semiconductor chip 5330 may be disposed over a surface of the first dielectric layer 5410 in a surface mount region 13. The second semiconductor chip 5330 may be disposed such that a portion of the second semiconductor chip 5330 overlaps a portion of the first semiconductor chip 5310 embedded under the first dielectric layer 5410.

The second semiconductor chip 5330 may include second contact portions 5335 which are electrically coupled to the first contact portions 5315 of the first semiconductor chip 5310 and fourth contact portions 5336 which are separated from the second contact portions 5335. The second semiconductor chip 5330 may be disposed over the first dielectric layer 5410 such that the second contact portions 5335 are vertically aligned with the first contact portions 5315 of the first semiconductor chip 5310.

The embedded package 50 may include first internal contact portions 5255 that electrically couple the first contact portions 5315 to the second contact portions 5335. The first internal contact portions 5255 may constitute a circuit interconnection portion that electrically couples the first and second semiconductor chips 5310 and 5330 to the external connection joints 5600. The second contact portions 5335 may be electrically coupled to respective ones of the first contact portions 5315 through the first internal contact portions 5255. The first internal contact portions 5255 may be disposed to vertically penetrate the first dielectric layer 5410. The first contact portions 5315 may be output terminals of the first semiconductor chip 5310 and may be electrically coupled to the second contact portions 5335 of the second semiconductor chip 5330.

A third circuit interconnection portion 5250 may be disposed on the first dielectric layer 5410 of the embedded package 50. The third circuit interconnection portion 5250 may extend into the first dielectric layer 5410 to electrically couple the first semiconductor chip 5310 to the external connection joints 5600. The third circuit interconnection portion 5250 may include first circuit interconnection lines 5253, and each of the first circuit interconnection lines 5253 may include a third internal contact portion 5254 that penetrates the first dielectric layer 5410 to contact one of the third contact portions 5316 of the first semiconductor chip 5310.

To electrically couple the fourth contact portions 5336 of the second semiconductor chip 5330 to the external connection joints 5600, second internal contact portions 5256 may be disposed in the first dielectric layer 5410. The second internal contact portions 5256 may electrically couple second circuit interconnection contact patterns 5216 constituting the first circuit interconnection portion 5210 to the fourth contact portions 5336.

The second circuit interconnection contact patterns 5216 coupled to the second internal contact portions 5256 may be electrically coupled to the external connection joints 5600 through the first circuit interconnection portion 5210. That is, the second circuit interconnection contact patterns 5216 may constitute a portion of an electrical signal path that electrically couples the second semiconductor chip 5330 to the external connection joints 5600.

Joint contact portions 5251 constituting the third circuit interconnection portion 5250 may be conductive patterns on which the external connection joints 5600 are disposed. To electrically couple the joint contact portions 5251 to interconnection contact portions 5211 constituting the first circuit interconnection portion 5210 disposed on a front surface of the core layer 5100 under the first dielectric layer 5410, fourth internal contact portions 5252 may be disposed to vertically penetrate the first dielectric layer 5410.

A first protection layer 5510 may cover the second circuit interconnection portion 5230 to physically protect and electrically insulate the second circuit interconnection portion 5230 from the external environment. Further, a second protection layer 5530 may be disposed over the first dielectric layer 5410 to cover the third circuit interconnection portion 5250 except the joint contact portions 5251 may be exposed by the second protection layer 5530. The embedded package 50 may further include a second dielectric layer 5430 covering the stack structure 5339 including the second and third semiconductor chips 5330 and 5331.

As described above, the embedded package 50 may include a plurality of stacked semiconductor chips. Thus, a capacity of the embedded package may be improved.

Figure 10:
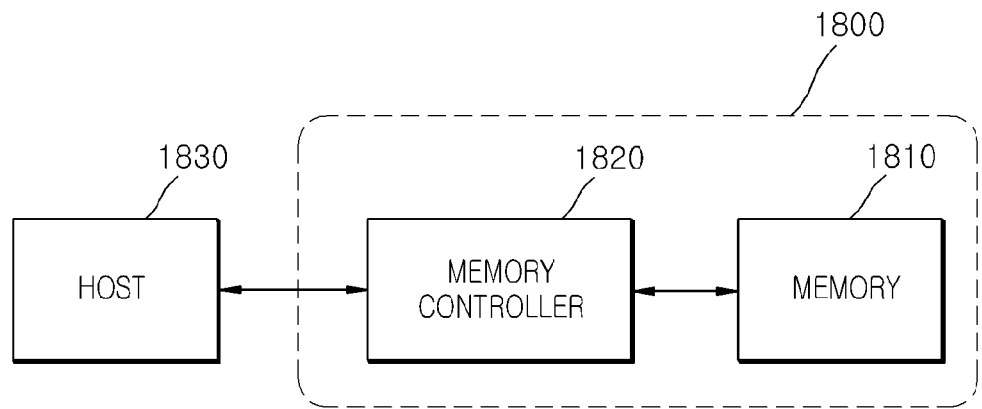
FIG. 10 is a block diagram illustrating an electronic system employing a memory card including an embedded package in accordance with an embodiment.

FIG. 10 is a block diagram illustrating an electronic system including a memory card 1800 including at least one embedded package according to an embodiment. The memory card 1800 includes a memory 1810, such as a nonvolatile memory device, and a memory controller 1820. The memory 1810 and the memory controller 1820 may store data or read stored data. The memory 1810 and/or the memory controller 1820 include one or more semiconductor chips disposed in an embedded package according to an embodiment.

The memory 1810 may include a nonvolatile memory device to which the technology of the embodiments of the present invention is applied. The memory controller 1820 may control the memory 1810 such that stored data is read out or data is stored in response to a read/write request from a host 1830.

Figure 11:
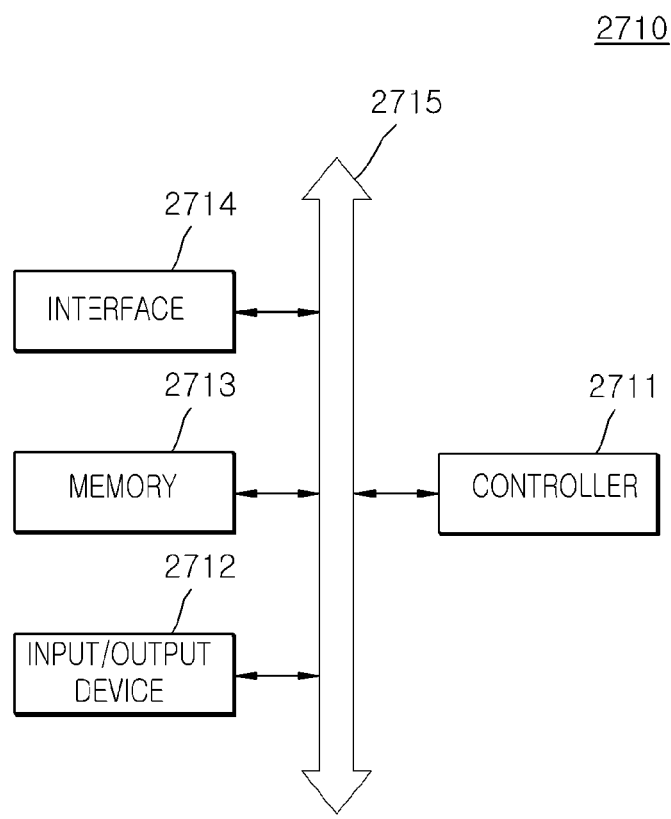
FIG. 11 is a block diagram illustrating an electronic system including an embedded package according to an embodiment.

FIG. 11 is a block diagram illustrating an electronic system 2710 including at least one embedded package according to an embodiment. The electronic system 2710 may include a controller 2711, an input/output device 2712, and a memory 2713. The controller 2711, the input/output device 2712 and the memory 2713 may be coupled with one another through a bus 2715 providing a path through which data move.

In an embodiment, the controller 2711 may include one or more microprocessor, digital signal processor, microcontroller, and/or logic device capable of performing the same functions as these components. The controller 2711 or the memory 2713 may include one or more of the semiconductor packages according to embodiments of the present disclosure. The input/output device 2712 may include at least one selected among a keypad, a keyboard, a display device, a touchscreen and so forth. The memory 2713 is a device for storing data. The memory 2713 may store data and/or commands to be executed by the controller 2711, and the like.

The memory 2713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 2710 may stably store a large amount of data in a flash memory system.

The electronic system 2710 may further include an interface 2714 configured to transmit and receive data to and from a communication network. The interface 2714 may be a wired or wireless type. For example, the interface 2714 may include an antenna or a wired or wireless transceiver.

The electronic system 2710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 2710 is an equipment capable of performing wireless communication, the electronic system 2710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. An embedded package comprising:
   a core layer including a cavity;
   a first semiconductor chip disposed in the cavity;
   a first dielectric layer disposed over the core layer and the first semiconductor chip;
   a second semiconductor chip disposed over the first dielectric layer in a surface mount region;
   a plurality of external connection joints disposed over the first dielectric layer and spaced apart from a sidewall of the second semiconductor chip;
   a second dielectric layer covering the second semiconductor chip; and
   an interconnection line disposed over the core layer and detouring around the cavity to connect one of the external connection joints to the second semiconductor chip,
   wherein the connection joints are aggregated into one group in a predetermined joint region that is on first side of a package substrate, which is opposite to a second side of the package substrate that includes a surface mount region in which the second semiconductor chip is disposed.

2. The embedded package of claim 1, wherein
   the joint region and the surface mount region are adjacent to a first edge and a second edge of the core layer, respectively; and
   the first edge and the second edge of the core layer are opposite to each other.

3. The embedded package of claim 1, further comprising one or more third semiconductor chips stacked on the second semiconductor chip.

4. The embedded package of claim 3, wherein the second and third semiconductor chips are coupled to each other using a through-silicon via.

5. The embedded package of claim 1, wherein three edges of the joint region are adjacent to first, third and fourth edges of the package substrate, respectively, and three edges of the surface mount region are adjacent to the third and fourth edges of the package substrate and a second edge of the package substrate, respectively.

6. The embedded package of claim 1, wherein the package only has one joint region and one surface mount region.

7. The embedded package of claim 1, wherein the semiconductor package consists of a first side and a second side, the joint region is entirely disposed in the first side of the package, and the surface mount region is entirely disposed in the second side of the package.

* * * * *